US011810701B2

(12) United States Patent
Hwang et al.

(10) Patent No.: US 11,810,701 B2
(45) Date of Patent: Nov. 7, 2023

(54) DEVICE AND METHOD FOR FORMING SKYRMION

(71) Applicant: KOREA RESEARCH INSTITUTE OF STANDARDS AND SCIENCE, Daejeon (KR)

(72) Inventors: Chan Yong Hwang, Seoul (KR); Kyoung Woong Moon, Daejeon (KR); Seung Mo Yang, Daejeon (KR); Chang Soo Kim, Seoul (KR)

(73) Assignee: KOREA RESEARCH INSTITUTE OF STANDARDS AND SCIENCE, Daejeon (KR)

( * ) Notice: Subject to any disclaimer, the term of this patent is extended or adjusted under 35 U.S.C. 154(b) by 365 days.

(21) Appl. No.: 17/318,613

(22) Filed: May 12, 2021

(65) Prior Publication Data

US 2022/0246340 A1    Aug. 4, 2022

(30) Foreign Application Priority Data

Feb. 2, 2021    (KR) .......................... 10-2021-0014791

(51) Int. Cl.
*H01F 10/32* (2006.01)
*H01F 7/06* (2006.01)
*G06T 7/00* (2017.01)
*G06F 18/22* (2023.01)

(52) U.S. Cl.
CPC .......... *H01F 10/324* (2013.01); *G06F 18/22* (2023.01); *G06T 7/001* (2013.01); *H01F 7/064* (2013.01); *G06T 2207/30108* (2013.01)

(58) Field of Classification Search
CPC ..... G11C 11/1675; G11C 16/06; G06F 18/22; G06T 7/001; G06T 2207/30108; H01F 7/064; H01F 10/324; H01F 41/32

USPC .......................................................... 361/139
See application file for complete search history.

(56) References Cited

U.S. PATENT DOCUMENTS 10,541,074 B2 *   1/2020   Büttner .................. H10N 50/00
2017/0256351 A1 *  9/2017   Cros ....................... H10N 50/00

FOREIGN PATENT DOCUMENTS

| KR | 2016008900 A | * | 1/2016 | ............... G11B 5/02 |
| KR | 2017135094 A | * | 12/2017 | ............ G11C 11/14 |
| KR | 101964904 B1 |   | 4/2019 | |

OTHER PUBLICATIONS

Machine translation of Hwang et al. Korean Patent Document KR 20160008900 A Jan. 25, 2016 (Year: 2016).*
Machine translation of Hwang et al. Korean Patent Document KR 20170135094 A Dec. 8, 2017 (Year: 2017).*
Je, et al. "Creation of Magnetic Skyrmion Bubble Lattices by Ultrafast Laser in Ultrathing Films".

* cited by examiner

*Primary Examiner* — Kevin J Comber
(74) *Attorney, Agent, or Firm* — TAROLLI, SUNDHEIM, COVELL & TUMMINO L.L.P

(57) ABSTRACT

The present disclosure relates to a device and method for forming skyrmion in a magnetic thin film. A skyrmion forming method comprises aligning the surface of the magnetic thin film and a horizontal magnetic field to be applied to the magnetic thin film and applying the horizontal magnetic field and a vertical magnetic field to the magnetic thin film. Accordingly, it is possible to form the bubble skyrmion easily even in the case of a wide width of a stripe formed on the magnetic thin film.

16 Claims, 12 Drawing Sheets

(a)                  (b)

DEVICE AND METHOD FOR FORMING SKYRMION

CROSS-REFERENCE TO RELATED APPLICATION

This application claims the benefit under 35 USC 119(a) of Korean Patent Applications No. 10-2021-0014791, filed Feb. 2, 2021, the entire disclosure of which is incorporated herein by reference for all purposes.

BACKGROUND

A traditional micro electronic device performs an electric charge transfer operation based on electrons, whereas a spin electronic device performs storage, transmission, and processing of information based on spin properties of electrons. Skyrmion that is used by a spin electronic device refers to a swirl-shaped topological spin structure generated on the surface of a ferromagnetic layer. Because the skyrmion has a very small diameter of a several nanometers and has a relatively small minimum current density for starting operation, the skyrmion can be useful in constructing magnetic memories or logic elements.

However, it can be said that the biggest problem in constructing a magnetic memory or a logic element by using the skyrmion is to generate the skyrmion quickly in a controlled state.

In this regard, Korean Patent No. 10-1964904 discloses that when a sine wave current or cosine wave current is applied to a conducting wire, a rotational current is applied to the magnetic layer, thereby forming skyrmion. A paper "Creation of magnetic skyrmion bubble lattices by ultrafast laser in ultrathin films" discloses that bubble skyrmion is formed by applying vertically a single laser pulse for 35 femtoseconds.

However, these conventional technologies have a problem that skyrmion may not be formed when the width of the stripe domain formed on the magnetic thin film is wide.

PRIOR ART DOCUMENT

Patent Document

1. Korean Patent No. 10-1964904

Non-Patent Document

1. Soong-Geun Je, Pierre Vallobra, Titiksha Srivastava1, Juan-Carlos Rojas-Sánchez, Thai Ha Pham2, Michel Hehn, Gregory Malinowski, Claire Baraduc, Stéphane Auffret, Gilles Gaudin, Stéphane Mangin, Hélène Béa, Olivier Boulle, "Creation of Magnetic Skyrmion Bubble Lattices by Ultrafast Laser in Ultrathin Films," Nano letters, 2018, 18, 11, 7362-7371.

SUMMARY

Various embodiments relate to a device and method for forming skyrmion in a magnetic thin film.

Various embodiments provide a method for solving the aforementioned problems and forming skyrmion even on a magnetic thin film with a stripe structure having a large width, and a device of the same.

Also, various embodiments provide a method which can be applied to a magnetic thin film with any stripe width and is capable of forming bubble skyrmion even on a magnetic thin film in which the stripe structure is not observed due to the stripe width larger than the size of the magnetic thin film, and provide a device of the same.

The technical problem to be overcome in this document is not limited to the above-mentioned technical problems. Other technical problems not mentioned can be clearly understood from those described below by a person having ordinary skill in the art.

One embodiment is a skyrmion forming device which forms bubble skyrmion on a magnetic thin film of which a portion is magnetized in an upward direction perpendicular to a surface of the magnetic thin film and of which another portion is magnetized in a downward direction perpendicular to the surface of the magnetic thin film. The skyrmion forming device may include: a horizontal magnetic field generator which generates a horizontal magnetic field horizontal to the surface of the magnetic thin film and applies to the magnetic thin film; a vertical magnetic field generator which generates a vertical magnetic field perpendicular to the surface of the magnetic thin film and applies to the magnetic thin film; an angle adjustment device which controls an angle such that the horizontal magnetic field and the surface of the magnetic thin film are aligned; and a control device. The control device may align the horizontal magnetic field and the surface of the magnetic thin film by controlling the angle adjustment device and may cause the horizontal magnetic field and the vertical magnetic field to be applied to the magnetic thin film by controlling the horizontal magnetic field generator and the vertical magnetic field generator.

According to various embodiments of the present disclosure, the skyrmion forming device may further include an imaging device which captures a magnetization state of the magnetic thin film, and the control device may control the angle adjustment device based on the magnetization state of the magnetic thin film obtained through the imaging device.

According to various embodiments of the present disclosure, the control device may obtain, from the imaging device, a first image showing the magnetization state of the magnetic thin film when the horizontal magnetic field is not applied, may obtain, from the imaging device, a second image showing the magnetization state of the magnetic thin film after the horizontal magnetic field is applied, may determine, by comparing the first image and the second image, whether the magnetization state of the magnetic thin film is changed, and may control the angle adjustment device based on the result of the determination.

According to various embodiments of the present disclosure, the first image and the second image may include a first direction magnetic domain which shows a magnetized region in a first direction. The first direction may be the upward direction or the downward direction. The control device may compare an area of the first direction magnetic domain of the first image and an area of the first direction magnetic domain of the second image. When the area is changed, the control device may determine that there is a change in the magnetization state of the magnetic thin film. When the area is not changed, the control device may determine that there is no change in the magnetization state of the magnetic thin film and thus the horizontal magnetic field and the surface of the magnetic thin film are aligned.

According to various embodiments of the present disclosure, the angle adjustment device may adjust a position of the surface of the magnetic thin film based on the control of the control device.

According to various embodiments of the present disclosure, the angle adjustment device may adjust an emission angle of the horizontal magnetic field emitted by the horizontal magnetic field generator or a position of the horizontal magnetic field generator, based on the control of the control device.

According to various embodiments of the present disclosure, the angle adjustment device may additionally adjust an emission angle of the vertical magnetic field emitted by the vertical magnetic field generator based on the control of the control device.

Another embodiment is a skyrmion forming method of a skyrmion forming device which forms bubble skyrmion on a magnetic thin film of which a portion is magnetized in an upward direction perpendicular to a surface of the magnetic thin film and of which another portion is magnetized in a downward direction perpendicular to the surface of the magnetic thin film may include: aligning the surface of the magnetic thin film and a horizontal magnetic field to be applied to the magnetic thin film; and applying the horizontal magnetic field and a vertical magnetic field to the magnetic thin film.

According to various embodiments of the present disclosure, the aligning the surface of the magnetic thin film and a horizontal magnetic field to be applied to the magnetic thin film may include controlling an angle adjustment device based on a magnetization state of the magnetic thin film.

According to various embodiments of the present disclosure, the controlling the angle adjustment device based on the magnetization state of the magnetic thin film obtained through an imaging device may include: obtaining a first image showing the magnetization state of the magnetic thin film when the horizontal magnetic field is not applied; obtaining a second image showing the magnetization state of the magnetic thin film after the horizontal magnetic field is applied; determining, by comparing the first image and the second image, whether the magnetization state of the magnetic thin film is changed; and controlling the angle adjustment device based on the result of the determination.

According to various embodiments of the present disclosure, the first image and the second image may include a first direction magnetic domain which shows a magnetized region in a first direction. The first direction may be the upward direction or the downward direction. Determining, by comparing the first image and the second image, whether the magnetization state of the magnetic thin film is changed may include: comparing an area of the first direction magnetic domain of the first image and an area of the first direction magnetic domain of the second image; determining that there is a change in the magnetization state of the magnetic thin film when the area is changed; and determining that there is no change in the magnetization state of the magnetic thin film when the area is not changed.

According to various embodiments of the present disclosure, the controlling the angle adjustment device may include controlling the angle adjustment device to adjust a position of the surface of the magnetic thin film.

According to various embodiments of the present disclosure, the controlling the angle adjustment device may include: controlling the angle adjustment device to adjust an emission angle of the horizontal magnetic field emitted by a horizontal magnetic field generator; or controlling the angle adjustment device to adjust a position of the horizontal magnetic field generator.

According to various embodiments of the present disclosure, the controlling the angle adjustment device may further include controlling the angle adjustment device to adjust an emission angle of the vertical magnetic field of a vertical magnetic field generator.

Further another embodiment is a skyrmion forming device which forms bubble skyrmion on a magnetic thin film of which a portion is magnetized in an upward direction perpendicular to a surface of the magnetic thin film and of which another portion is magnetized in a downward direction perpendicular to the surface of the magnetic thin film. The skyrmion forming device may include: a magnetic field generator which applies a magnetic field to the magnetic thin film; an angle adjustment device which controls the magnetic field and the surface of the magnetic thin film to have a predetermined angle; and a control device. The control device may control the angle adjustment device such that the magnetic field and the surface of the magnetic thin film have the predetermined angle and may control the magnetic field generator to emit the magnetic field to the magnetic thin film.

According to various embodiments of the present disclosure, the skyrmion forming device may further include an imaging device which captures a magnetization state of the magnetic thin film, and the control device may determine whether the bubble skyrmion is formed on the magnetic thin film, based on the magnetization state of the magnetic thin film obtained through the imaging device.

According to various embodiments of the present disclosure, the angle adjustment device may adjust an emission angle of the magnetic field emitted by the magnetic field generator or a position of the magnetic field generator, based on the control of the control device.

The device and method proposed by the present disclosure can form bubble skyrmion easily even in the case of a wide width of a stripe formed on the magnetic thin film.

Advantageous effects that can be obtained from the present disclosure are not limited to the above-mentioned effects. Further, other unmentioned effects can be clearly understood from the following descriptions by those skilled in the art to which the present disclosure belongs.

BRIEF DESCRIPTION OF THE DRAWINGS

With regard to the description of the drawings, the same or similar reference numerals may be used for the same or similar components.

DETAILED DESCRIPTION

Figure 1:
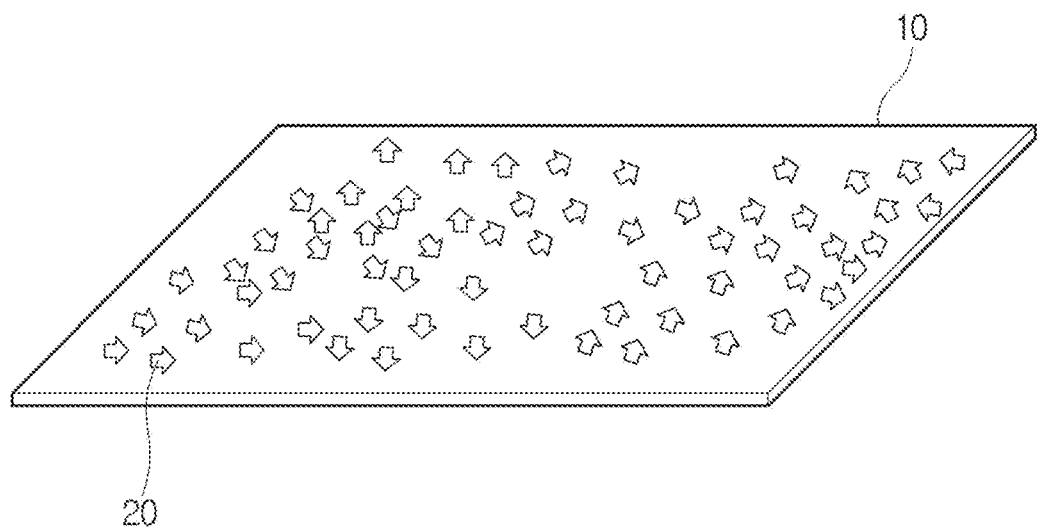
FIG. 1 is a view showing an example of a magnetic thin film.

Hereinafter, embodiments of the present disclosure will be described in detail with reference to the accompanying drawings, in which the same or similar components will be given the same reference numerals, and redundant description thereof will be omitted.

In the following, specific details may be set forth to provide an understanding of the invention. However, it will be apparent to a person skilled in the art that the present invention may be practiced without these details. In addition, those of ordinary skill in the art will recognize that various embodiments of the present invention described below may be implemented in a variety of ways, such as a process, an apparatus, a system, or a method on a computer-readable medium.

The components shown in the drawings are only illustrating exemplary embodiments of the present invention, and are intended to avoid obscuring the invention. In addition, connections between components in the drawings are not limited to direct connections. Rather, data between these components may be modified, reformatted or otherwise changed by an intermediate component or device. Also, additional or fewer connections can be used. The terms "connected" or "communicatively connected" should be understood to include direct connections, indirect connections through one or more intermediary devices, and wireless connections.

FIG. 1 is view showing an example of a magnetic thin film.

Referring to FIG. 1, a magnetic thin film 10 may be referred to as a magnetic thin film having magnetic atoms. Here, the magnetic atom may mean an atomic-sized bar magnet, and may be represented by a magnetization vector 20 having a constant size. In this case, the magnetization vector 20 may be represented in a direction from the S pole to the N pole.

In the magnetic thin film 10, the magnetization vector 20 representing the magnetic atom has a constant size. However, the magnetization vector 20 does not have a particular direction, and the magnetization vector 20 may have a degree of freedom in any direction as shown in FIG. 1. In particular, the magnetic thin film may be a magnetic material in which the magnetic atoms are uniformly embedded in a two-dimensional plane.

A ferromagnetic material may be a magnetic material having a property in which adjacent magnetic atoms point in the same direction. That is, in the case of the ferromagnetic material, as shown in FIG. 1, each magnetization vector 20 does not point in a random direction, and adjacent magnetization vectors 20 may have a property of pointing in the same direction.

Accordingly, the magnetic thin film 10 having ferromagnetic properties may have a magnetic domain and a magnetic domain wall region.

Figure 2:
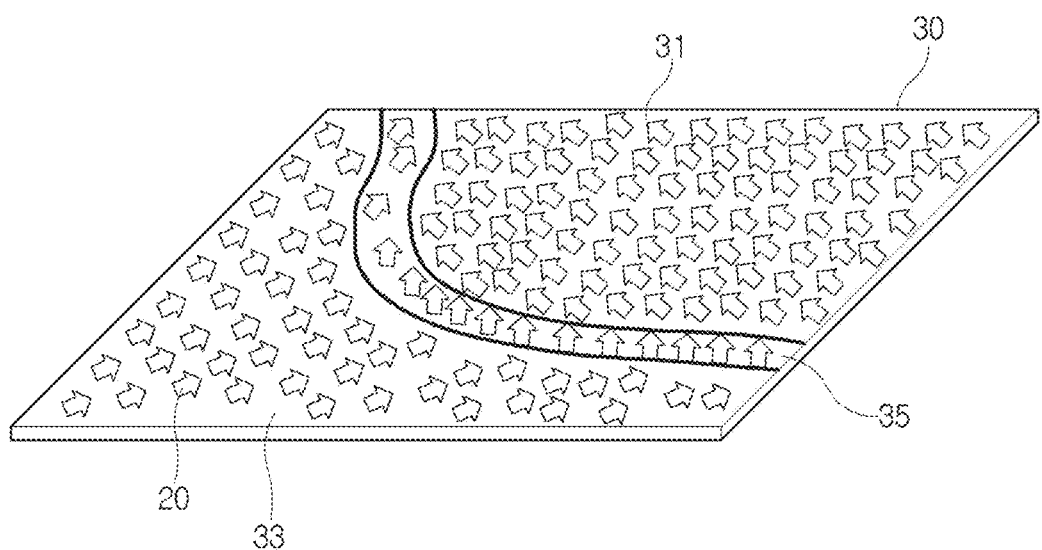
FIG. 2 is a view showing examples of a magnetic domain and a magnetic domain wall of the magnetic thin film 30.

FIG. 2 is a view showing examples of the magnetic domain and the magnetic domain wall of the magnetic thin film 30.

The magnetic domains 31 and 33 represent a region in which the magnetic atoms have a particular magnetization direction, that is, a region in which the magnetization vectors 20 have the same direction.

The magnetic domain wall 35 represents a region in which the magnetization direction gradually changes at the boundary between the magnetic domains 31 and 33. That is, in order to change the magnetization direction in the magnetic domain 33 from the magnetization direction in the magnetic domain 31, the direction of the magnetization vector 20 between them must be gradually changed. As such, the region in which the direction of the magnetization vector 20 is gradually changed may be referred to as the magnetic domain wall 35.

Figure 3:
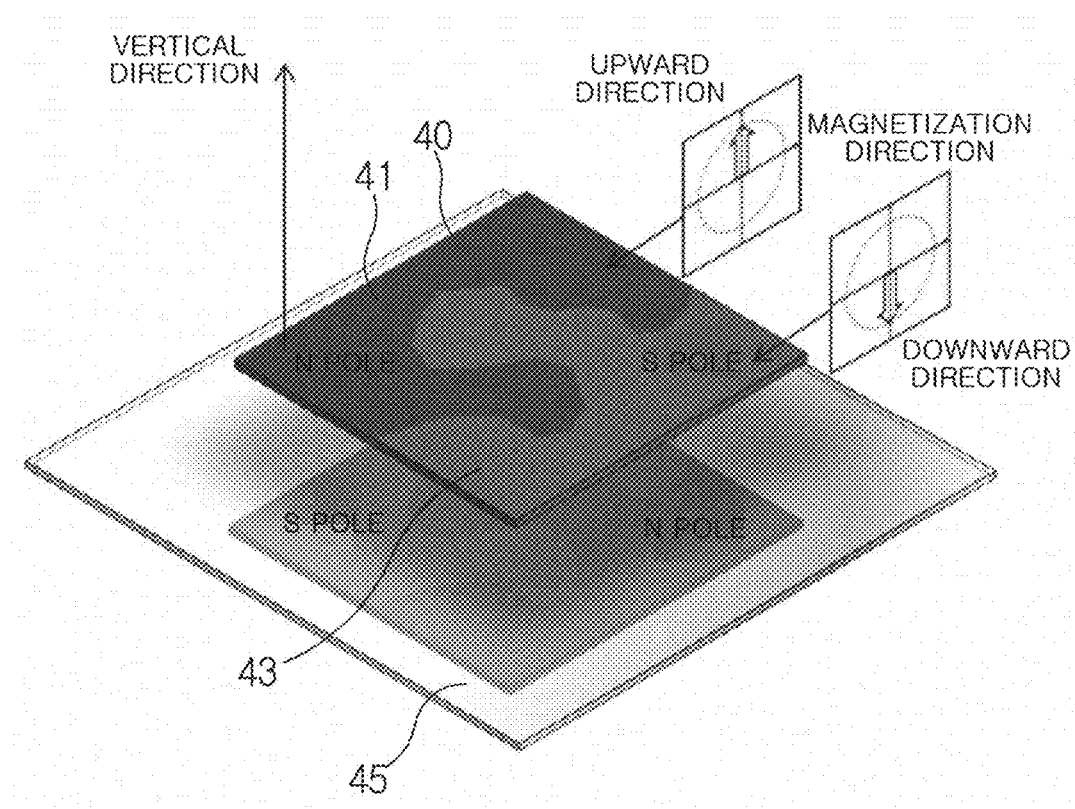
FIG. 3 is a view showing an example of a vertical magnetic thin film.

FIG. 3 is a view showing an example of a vertical magnetic thin film.

The vertical magnetic thin film 40 may be a magnetic material having a preference for the direction of the magnetization vector 20, which is perpendicular to the magnetic thin film (upward or downward direction).

Referring to FIG. 3, a magnetic domain 41 of the vertical magnetic thin film 40 may be a region in which the direction of the magnetization vector 20 is an upward direction, and a magnetic domain 43 is a region in which the direction of the magnetization vector 20 is a downward direction. Therefore, only the N pole can be seen when viewed from the top surface of the magnetic domain 41, and only the S pole can be seen when viewed from the bottom surface of the magnetic domain. In the case of the magnetic domain 43, only the S pole can be seen when viewed from the top surface of the magnetic domain 43, and only the N pole can be seen when viewed from the bottom surface. In FIG. 3, a vertical magnetic thin film 45 which is slightly blurred in the lower part of the drawing shows an appearance of the bottom surface of the vertical magnetic thin film 40 which is reflected in a mirror. The S pole on the bottom surface of the magnetic domain 41 and the N pole on the bottom surface of the magnetic domain 43 are shown.

Figure 4:
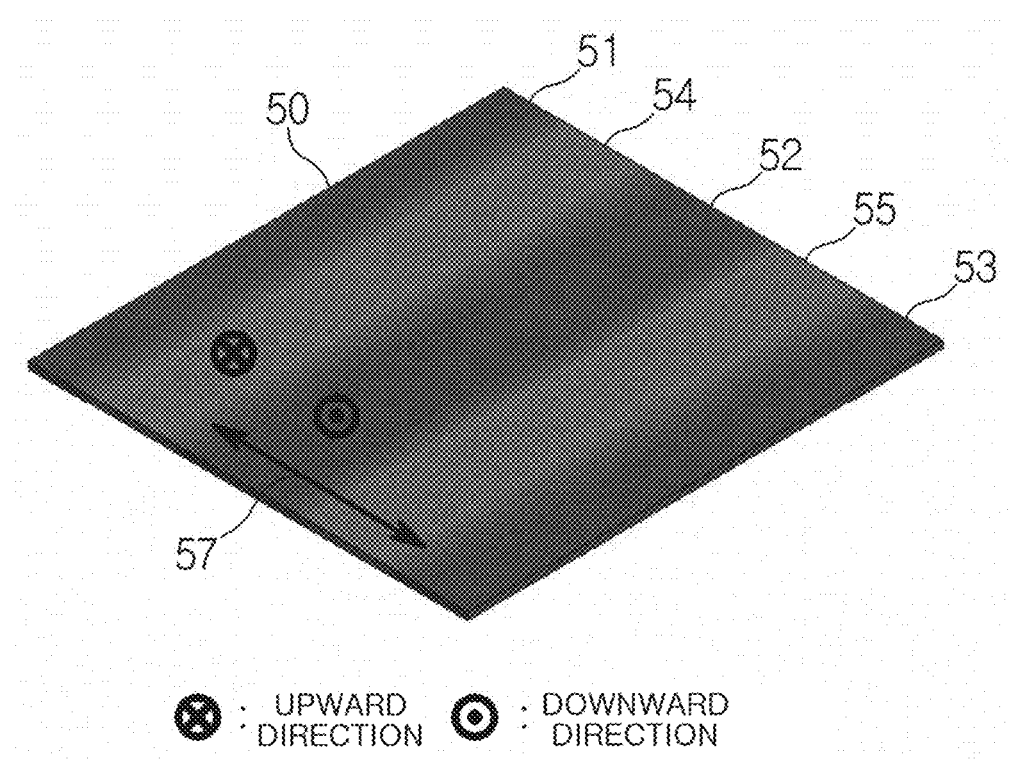
FIG. 4 is a view showing an example of the vertical magnetic thin film in a stripe magnetization state.

FIG. 4 is a view showing an example of the vertical magnetic thin film in a stripe magnetization state.

Referring to FIG. 4, it can be said that a vertical magnetic thin film 50 is in a stripe magnetization state, i.e., in a magnetization state in which a state (51, 52, 53) where the magnetization direction is an upward direction and a state (54, 55) where the magnetization direction is a downward direction are repeated and well mixed. When an external magnetic field is 0, it may be stable that the upward magnetization state and the downward magnetization state exist in half and half. Also, a stripe width 57 may be determined as a sum of the width of one upward magnetization state region and the width of one downward magnetization state region, which are continuous. The stable stripe width 57 may be determined based on a constituent material parameter.

Figure 5:
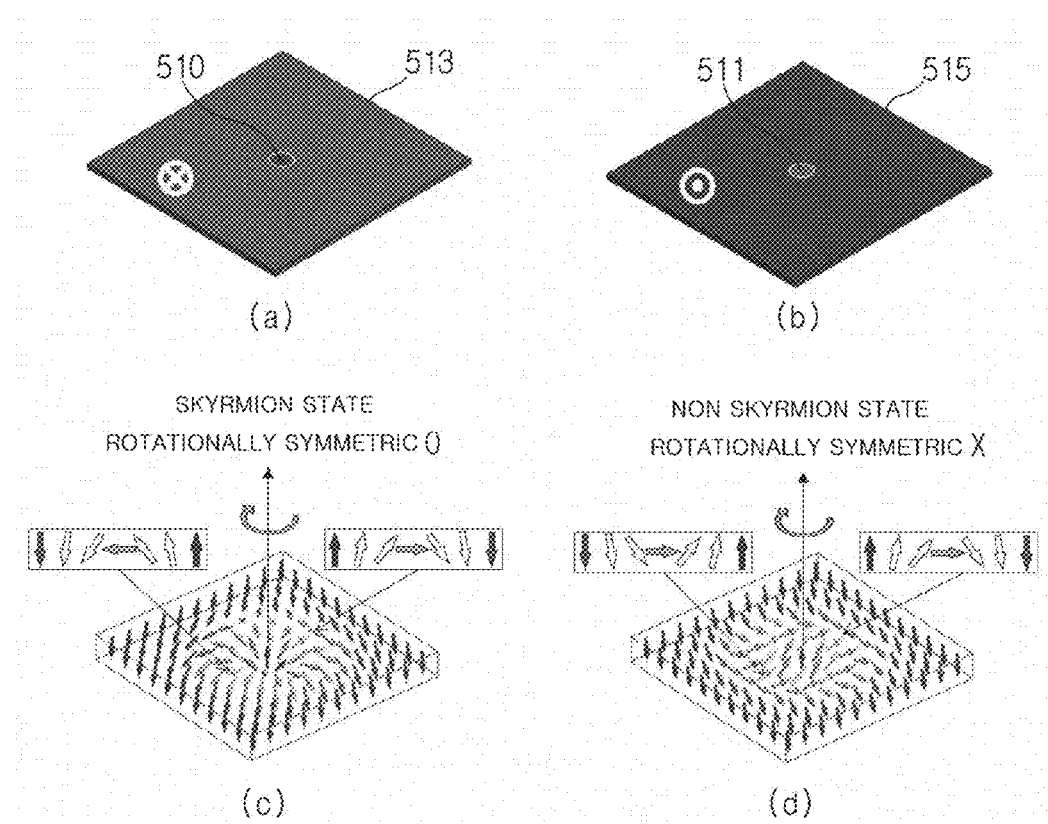
FIG. 5 is a view showing an example of a skyrmion magnetization state.

FIG. 5 is a view showing an example of a skyrmion magnetization state.

In the vertical magnetic thin film, skyrmions may exist mostly as round areas.

A skyrmion region 510 composed of at least one magnetic atom magnetized upward and a region 513 composed of the magnetic atoms magnetized downward around the skyrmion region 510 are shown in (a) of FIG. 5. A skyrmion region 511 composed of at least one magnetic atom magnetized downward and a region 515 composed of the magnetic atoms magnetized upward around the skyrmion region 511 are shown in (b) of FIG. 5. In the case of (a) of FIG. 5, the top surface of the skyrmion region 510 becomes the N pole, and the top surface of the region 513 of the magnetic atoms around the skyrmion region 510 becomes the S pole. In the case of (b) of FIG. 5, the top surface of the skyrmion region 511 becomes the S pole, and the top surface of the region 515 of the magnetic atoms around the skyrmion region 511 becomes the N pole.

When the vertical magnetic thin film includes the skyrmion state, the magnetic atoms are rotationally symmetric with respect to the skyrmion region. That is, the magnetic atoms in the magnetic domain wall between the skyrmion region and the region of the magnetic atoms around the skyrmion region have a magnetization state where the magnetic atoms are, as shown in (c) of FIG. 5, rotationally symmetric with respect to the skyrmion region. If the magnetic atoms in the magnetic domain wall are not rotationally symmetric with respect to a region having an opposite magnetization state as shown in (d) of FIG. 5, the vertical magnetic thin film may not include the skyrmion state.

Figure 6:
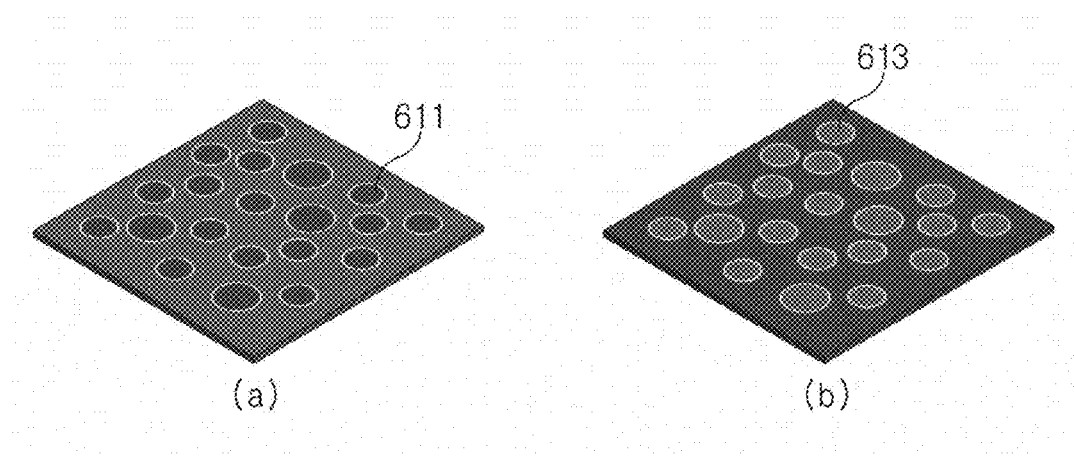
FIG. 6 is a view showing an example of a bubble magnetization state.

FIG. 6 is a view showing an example of a bubble magnetization state.

Referring to FIG. 6, a state in which a large number of bubble domains 611 and 613 are formed in the vertical magnetic thin film may be referred to as a bubble magnetization state. The bubble domain 611 may be in the upward magnetization state, or the bubble domain 613 may be in the downward magnetization state. In addition, the bubble domains 611 and 613 may be skyrmions.

Figure 7:
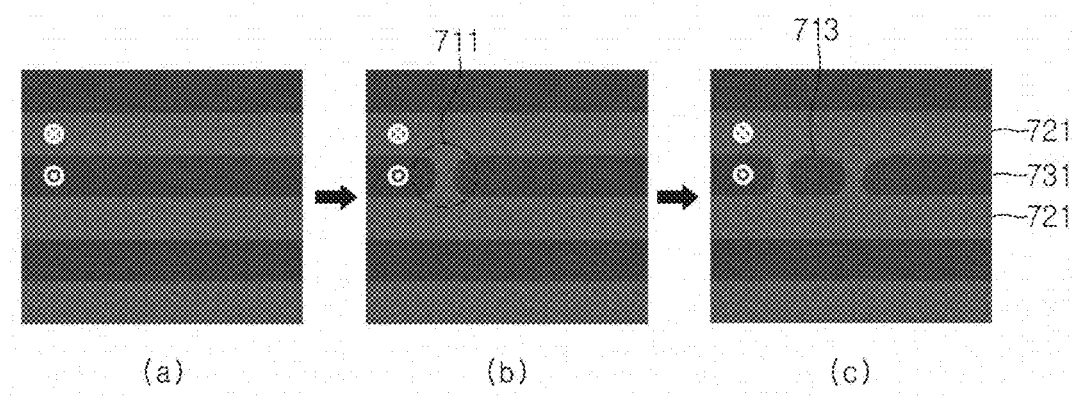
FIG. 7 is a view showing an example of converting a stripe domain into a bubble domain.

FIG. 7 is a view showing an example of converting a stripe domain into the bubble domain.

As shown in (a) of FIG. 7, the vertical magnetic thin film may have a stripe shape in which an upward magnetic domain and a downward magnetic domain are repeated.

Referring to (b) of FIG. 7, when energy is applied in the state of (a) of FIG. 7, it is possible to change (711) a part of the upward magnetic domain or the downward magnetic domain into a different magnetic domain while breaking the stripe structure.

When additional energy is supplied, many regions where a part of the upward magnetic domain or the downward magnetic domain is changed into a different magnetic domain are formed. As a result, independent bubble domains 713 may be formed. Here, the formed bubble domain 713 is highly likely to be in the skyrmion state.

Energy must be applied in order to generate the bubble domain in the magnetic domain of the stripe structure shown in FIG. 7. The energy may be a magnetic field perpendicular to the vertical thin film.

Figure 8:
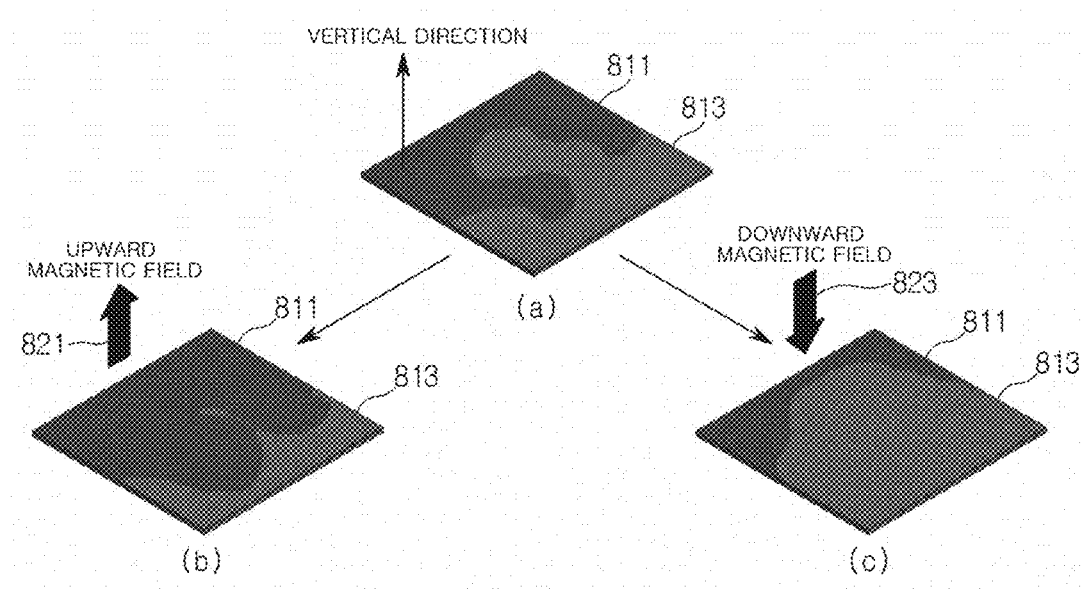
FIG. 8 is a view showing an effect of a vertical magnetic field which is applied to the vertical magnetic thin film.

FIG. 8 is a view showing an effect of a vertical magnetic field which is applied to the vertical magnetic thin film.

If there is no magnetic field applied to the vertical magnetic thin film, it may be stable that an upward magnetic domain 811 and a downward magnetic domain 813 have the same size as shown in (a) of FIG. 8. However, when an upward magnetic field 821 is applied, it is more stable that the upward magnetic domain 811 occupies more regions, so that the region of the upward magnetic domain 811 may be widened as shown in (b) of FIG. 8. Conversely, when a downward magnetic field 823 is applied, it is more stable that the downward magnetic domain 813 occupies more regions, so that the region of the downward magnetic domain 813 may be widened as in (c) of FIG. 8.

Accordingly, if the downward magnetic field is applied to the vertical magnetic thin film having the stripe structure shown in FIG. 7, the upward magnetic domain 731 is broken while the region of the downward magnetic domain 721 is widened, and the bubble domain 713 may be generated.

Conventionally, as shown in FIG. 7, a method of breaking the stripe structure by applying the vertical magnetic field and of generating the bubble domain was used. As shown in FIG. 7, in order to break the stripe structure and to generate the bubble domain, energy to reverse the magnetization direction of a certain volume (area to be changed x thickness of the vertical magnetic thin film) must be supplied. Typically, the magnetization state may be reversed due to thermal fluctuation (thermal energy). If energy enough to reverse the magnetization state is not supplied, the bubble domain will not be appropriately generated.

On the other hand, in the vertical magnetic thin film having the stripe structure, the width of the stripe is determined by the material parameter. If the width is large, the area where the magnetization direction should be reversed becomes wider, more energy is required, and if the width is small, the area where the magnetization direction should be reversed becomes narrow, so that the bubble domain can be sufficiently generated even by applying only a smaller amount of energy. Therefore, when the bubble domain is desired to be generated by applying only the vertical magnetic field, the vertical magnetic field is applicable only to a magnetic thin film having a sufficiently thin stripe width.

In the case of a magnetic thin film having a wide stripe width, there is a possibility that the bubble domain cannot be generated by applying only the vertical magnetic field or only a very small part of the bubble domain is generated. Otherwise, it is necessary to apply a very high magnetic field.

In order to solve this problem, the present invention proposes a device and method for forming a bubble domain-shaped skyrmion even in the vertical magnetic thin film having a wide stripe width. In particular, the present invention proposes the use of the horizontal magnetic field applied in parallel to the direction of the magnetic thin film, which can reduce the stripe width.

Figure 9:
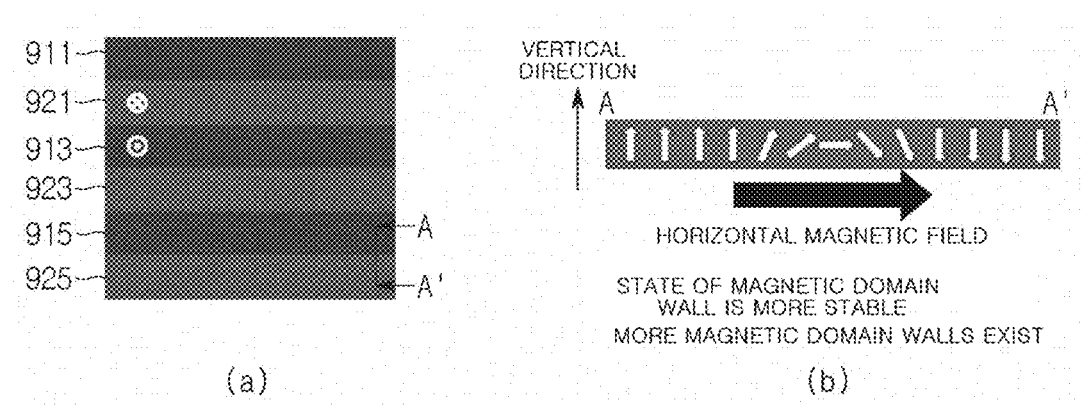
FIG. 9 is a view for describing a phenomenon in which a horizontal magnetic field is applied to the stripe structured vertical magnetic thin film.

FIG. 9 is a view for describing a phenomenon in which the horizontal magnetic field is applied to the stripe structured vertical magnetic thin film.

Referring to (a) of FIG. 9, in the vertical magnetic thin film having a stripe structure in which upward magnetic domains 911, 913, and 915 and downward magnetic domains 921, 923, and 925 exist alternately, the magnetic domain wall may exist between the upward magnetic domains 911, 913, and 915 and between the downward magnetic domains 921, 923, and 925. If a part (A-A') where the magnetic domain wall exists is enlarged, it can be seen that the magnetization direction of the magnetic atom changes, as shown in (b) of FIG. 9, little by little as the magnetic atoms move from the upward magnetic domain 915 to the downward magnetic domain 925. In addition, one of the magnetization directions existing in the magnetic domain wall may be a horizontal direction. In such a situation, when the horizontal magnetic field is applied, it may be more stable that the magnetization direction becomes the horizontal direction, and accordingly, the state of the magnetic domain wall including the horizontal magnetization direction may be more stable than the state of the upward magnetic domain or the downward magnetic domain which has the vertical magnetization direction. As a result, the magnetic domain wall may exist more than when the horizontal magnetic field is applied. In other words, the horizontal magnetic field reduces the energy of the magnetic domain wall to make the magnetic domain wall more stable, and as a result, prefers a state in which more magnetic domain walls exist. Therefore, as more magnetic domain walls exist, the stripe width of the vertical magnetic thin film having the stripe structure decreases inevitably.

Figure 10:
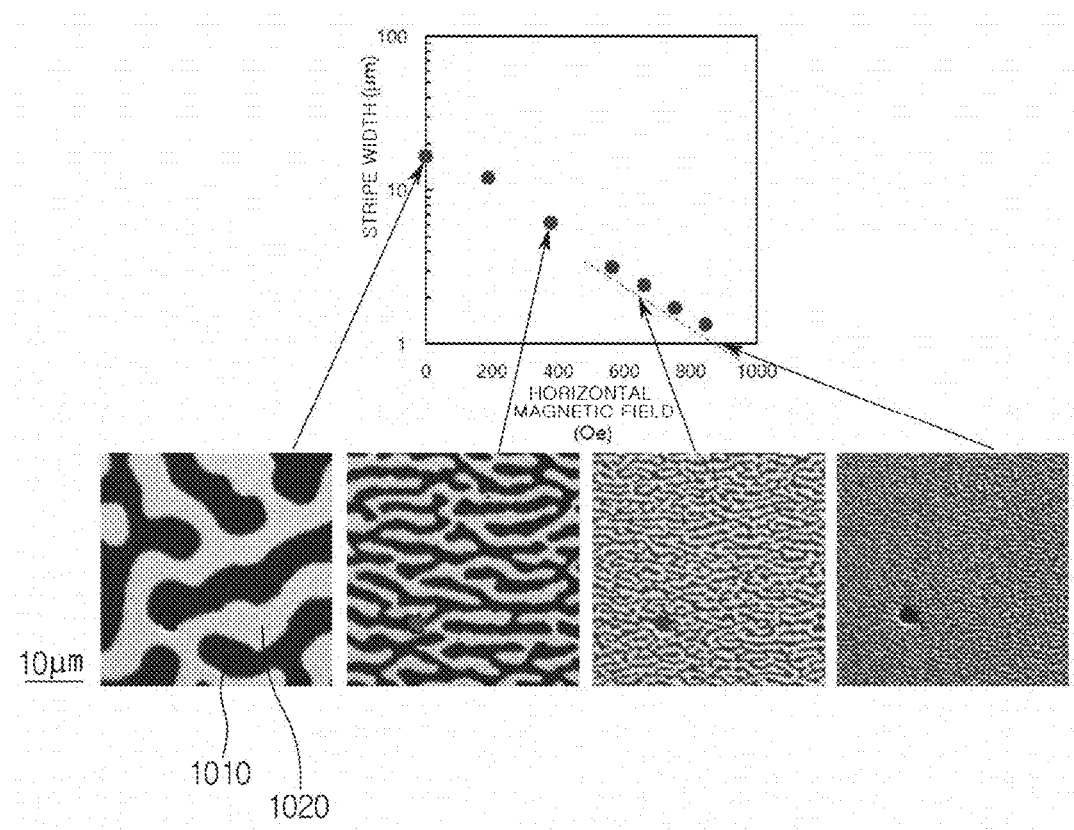
FIG. 10 is a view showing examples of widths of an upward magnetic domain and a downward magnetic domain when the horizontal magnetic field is applied to the vertical magnetic thin film.

FIG. 10 is a view showing examples of widths of the upward magnetic domain and the downward magnetic domain when the horizontal magnetic field is applied to the vertical magnetic thin film.

FIG. 10 shows a result of observation with a magneto-optical microscope while applying the horizontal magnetic field to the vertical magnetic thin film. A black region 1010 represents the downward magnetic domain and a white region 1020 represents the upward magnetic domain.

Referring to FIG. 10, it can be seen that the formed stripe width decreases with the increase of the intensity of the applied horizontal magnetic field increases, For example, when the horizontal magnetic field is not applied, the stripe width is about 18 µm, whereas when the horizontal magnetic field of 850 Oe is applied, the stripe width is reduced to about 1.5 µm. Here, Oe is called an oersted and a CGS unit of magnetic field strength (H). The CGS unit is based on centimeter, gram, and second.

Figure 11:
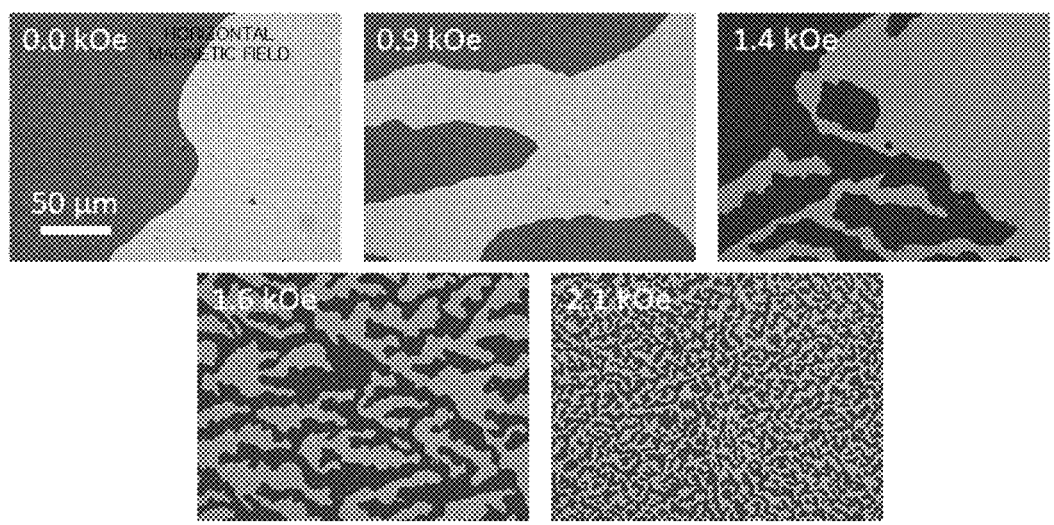
FIG. 11 is a view showing that the stripe width can be reduced by applying the horizontal magnetic field to the vertical magnetic thin film having a wider stripe width.

FIG. 11 is a view showing that the stripe width can be reduced by applying the horizontal magnetic field to the vertical magnetic thin film having a wider stripe width.

Referring to FIG. 11, it can be seen that as the horizontal magnetic fields of 0.9 kOe, 1.4 kOe, 1.6 kOe, and 2.0 kOe are initially applied to the vertical magnetic thin film having the stripe width of 50 um or more, more magnetic domain walls exist and the stripe width is reduced.

Figure 12:
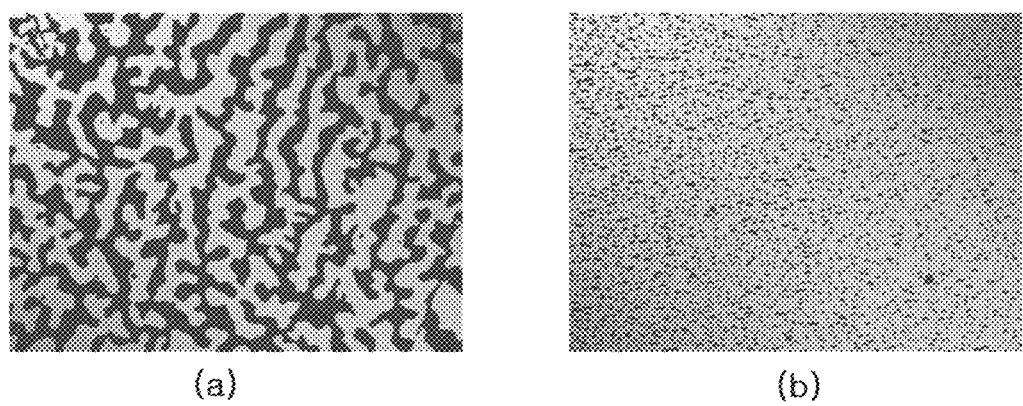
FIG. 12 is a view showing an example of forming bubble skyrmion by applying the horizontal magnetic field and the vertical magnetic field to the vertical magnetic thin film including a wide width stripe.

FIG. 12 is a view showing an example of forming bubble skyrmion by applying the horizontal magnetic field and the vertical magnetic field to the vertical magnetic thin film including a wide width stripe.

Referring to (a) of FIG. 12, the vertical magnetic thin film may include a wide stripe. When the horizontal magnetic field and the vertical magnetic field are applied to the vertical magnetic thin film shown in (a) of FIG. 12 for a certain period of time and then turned off, a vertical magnetic thin film that exists with the bubble skyrmion formed as shown in (b) of FIG. 12 can be obtained. Here, the strength of the applied horizontal magnetic field may be 2.4 kOe and the strength of the vertical magnetic field may be 3.5 Oe. According to this, the strength of the horizontal magnetic field can be nearly 1000 times greater than the strength of the vertical magnetic field.

As described above, if the horizontal magnetic field is applied, the bubble skyrmion can be more easily formed in the vertical magnetic thin film.

Figure 13:
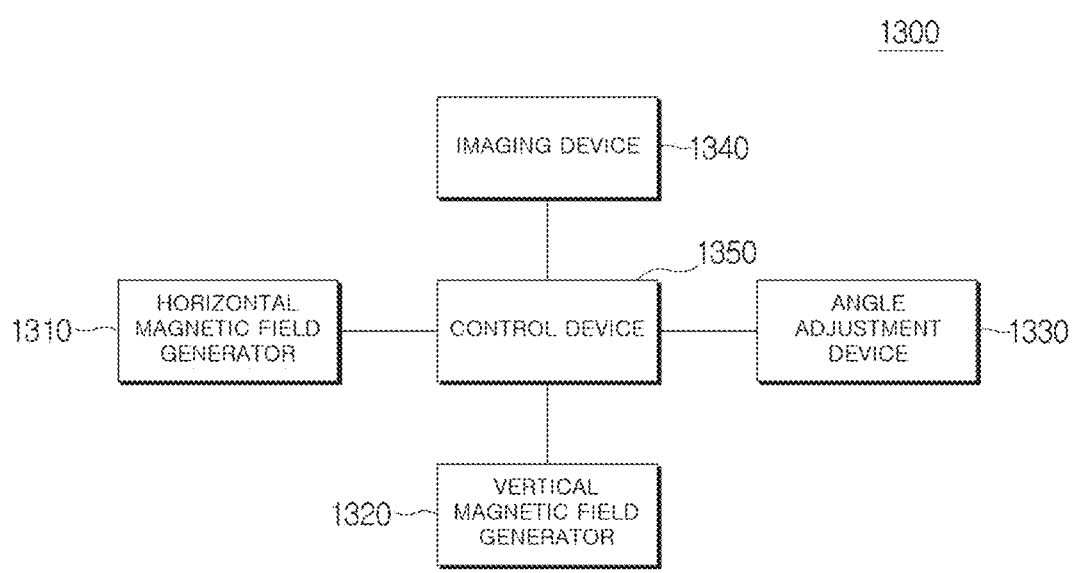
FIG. 13 is a view showing a block diagram of a skyrmion forming device according to various embodiments.

FIG. 13 is a view showing a block diagram of a skyrmion forming device according to various embodiments.

Referring to FIG. 13, the skyrmion forming device 1300 includes a horizontal magnetic field generator 1310, a vertical magnetic field generator 1320, an angle adjustment device 1330, an imaging device 1340, and a control device 1350.

The horizontal magnetic field generator 1310 may generate a horizontal magnetic field in a direction parallel to the surface of the vertical magnetic thin film. The horizontal magnetic field may reduce the width of the magnetic domain having the stripe structure formed on the vertical magnetic thin film.

The vertical magnetic field generator 1320 may generate a vertical magnetic field in a direction perpendicular to the surface of the vertical magnetic thin film. The vertical magnetic field may apply the thermal fluctuation to the vertical magnetic thin film so that a part of a first direction (e.g., upward direction) magnetic domain can be reversed to a second direction (e.g., downward direction) magnetic domain.

In other words, the horizontal magnetic field generator 1310 may reduce the stripe width to facilitate the change of the magnetization direction of the magnetic domain of the vertical magnetic field generator 1320.

The angle adjustment device 1330 may adjust such that the horizontal magnetic field and the surface of the vertical magnetic thin film are at the same angle. Referring to the result of FIG. 12, it can be seen that, in order to form a desired bubble skyrmion, the strength of the horizontal magnetic field must be about 1000 times greater than the strength of the vertical magnetic field. Accordingly, even if the angle between the horizontal magnetic field and the surface of the vertical magnetic thin film is twisted only by 1 degree, a vertical magnetic field of 42 Oe is additionally generated. The size of 42 Oe is more than 10 times larger than the vertical magnetic field of 3.5 Oe which was originally required. If this value of the vertical magnetic field is applied, it may be difficult to form the bubble skyrmion. Therefore, the angle adjustment device 1330 requires precise angle adjustment, and according to the embodiment, the angle adjustment device 1330 must be able to adjust the angle of 0.01 degrees or less.

The angle may be twisted whenever the vertical magnetic thin film is loaded in the device proposed in the present invention in order to generate the bubble skyrmion in the vertical magnetic thin film. Therefore, accurate angular alignment may be required whenever the vertical magnetic thin film is loaded.

The imaging device 1340 may measure the magnetization state of the vertical magnetic thin film in order to check the alignment of the horizontal magnetic field and/or to check whether the bubble skyrmions have been formed in the vertical magnetic thin film.

The alignment of the horizontal magnetic field according to the embodiment may be performed based on an area occupied by the upward magnetic domain and the downward magnetic domain existing in the vertical magnetic thin film. If the horizontal magnetic field is not aligned with respect to the surface of the vertical magnetic thin film, a portion of the vertical magnetic field may be applied to the vertical magnetic thin film, and accordingly, the area occupied by the upward magnetic domain and the downward magnetic domain may change. As described above, the magnetic atoms present in the vertical magnetic thin film have higher stability when they match the direction of the applied vertical magnetic field. Therefore, when, the vertical magnetic field exists because the horizontal magnetic field is not aligned with the vertical magnetic thin film, this serves to widen the area occupied by either the upward magnetic domain or the downward magnetic domain. Accordingly, the imaging device 1340 can capture the magnetization state of the surface the vertical magnetic thin film in the form of an image and send it to the control device 1350. The control device 1350 measures the change in the magnetization state of the surface of the vertical magnetic thin film and can determine whether or not they are aligned.

The control device 1350 may control the angle adjustment device 1330 in order to align the horizontal magnetic field generator 1310 and the surface of the vertical magnetic thin film, as described above. As described above, the control device 1350 should be capable of controlling very precisely the angle of 0.01 degrees or less.

The control device 1350 may determine the alignment of the horizontal magnetic field and the surface of the vertical magnetic thin film based on the change in the magnetization state of the vertical magnetic thin film obtained from the imaging device 1340. Further, the control device 1350 may control the angle adjustment device 1330 based on the determination result and control the horizontal magnetic field and the surface of the vertical magnetic thin film to be aligned. Here, the angle adjustment device 1330 may support the vertical magnetic thin film and adjust the angle or position of the vertical magnetic thin film to align the vertical magnetic thin film. According to another embodiment, the angle adjustment device 1330 may be positioned in the horizontal magnetic field generator 1310. The angle adjustment device 1330 may adjust an emission angle of the horizontal magnetic field emitted by the horizontal magnetic field generator or the position of the horizontal magnetic field generator 1310 such that the horizontal magnetic field can be aligned with the surface of the vertical magnetic thin film. Additionally, the angle adjustment device 1330 may be positioned in the vertical magnetic field generator 1320 and may adjust the angle such that the vertical magnetic field is perpendicular to the surface of the vertical magnetic thin film.

Figure 14:
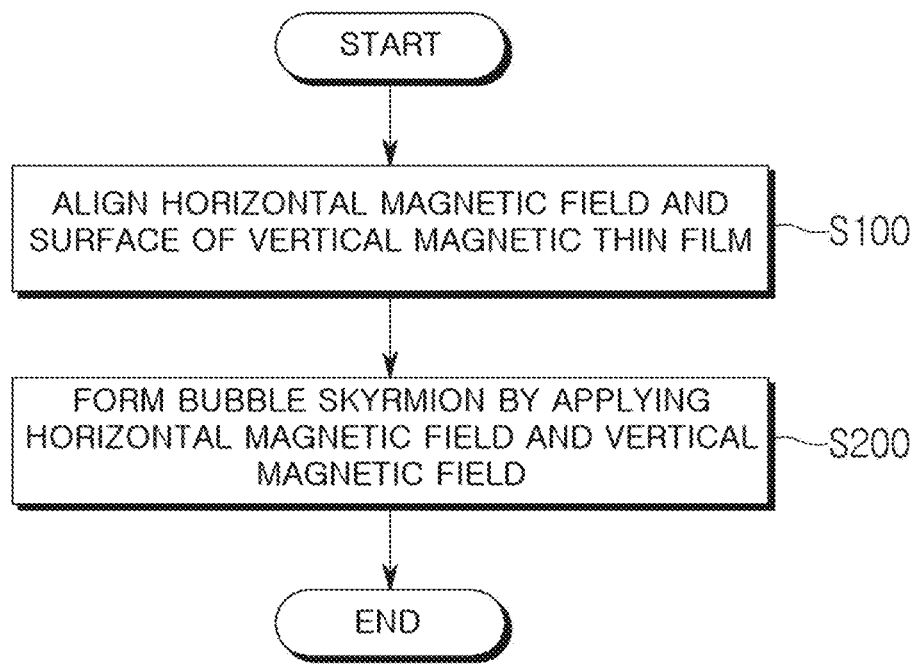
FIG. 14 is a view showing a method for forming bubble skyrmion in the skyrmion forming device 1300.

FIG. 14 is a view showing a method for forming the bubble skyrmion in the skyrmion forming device 1300.

Referring to FIG. 14, in step S100, the skyrmion forming device 1300 may align the horizontal magnetic field and the surface of the vertical magnetic thin film. As described above, if the horizontal magnetic field and the surface of the vertical magnetic thin film are not aligned, a portion of the horizontal magnetic field acts as the vertical magnetic field, and as a result, the bubble skyrmion may not be formed.

In step S200, the skyrmion forming device 1300 may form the bubble skyrmions by applying the horizontal magnetic field and the vertical magnetic field to the vertical magnetic thin film. Here, when the horizontal magnetic field serves to reduce the stripe width, the vertical magnetic field may serve to reverse the magnetization state in the first direction to the magnetization state in the second direction. According to the embodiment, when the upward vertical magnetic field is applied, a part of the region magnetized in the downward direction may be reversed to the upward direction, and when the downward vertical magnetic field is applied, a part of the region magnetized in the upward direction may be reversed to the downward direction.

Additionally, an operation of adjusting the angle such that the vertical magnetic field becomes perpendicular to the surface of the vertical magnetic thin film may be performed between step S100 and step S200.

Figure 15:
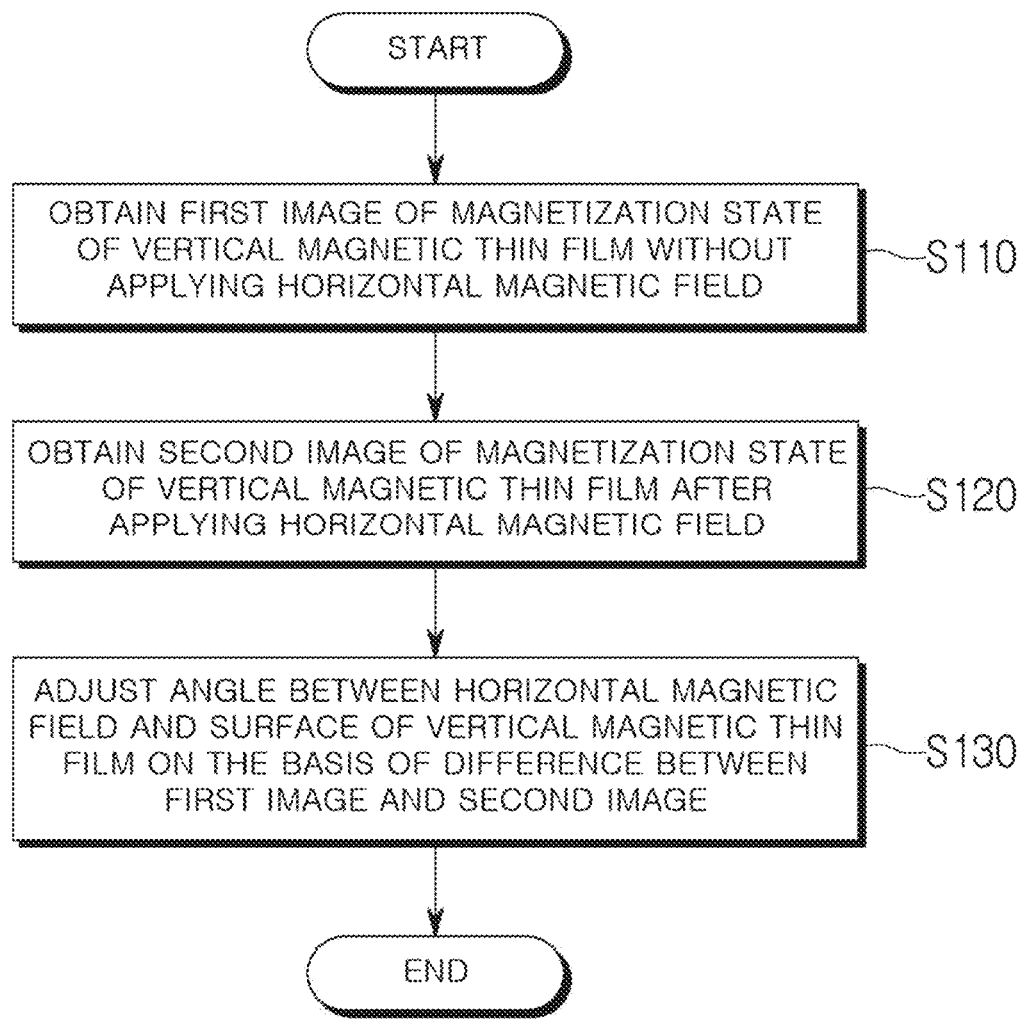
FIG. 15 is a view showing an embodiment of an operation of aligning the horizontal magnetic field and a surface of the vertical magnetic thin film in the skyrmion forming device 1300.

FIG. 15 is a view showing an embodiment of an operation of aligning the horizontal magnetic field and the surface of the vertical magnetic thin film in the skyrmion forming device 1300.

The embodiment of FIG. 15 may be considered as an example of step S100 of FIG. 14.

Referring to FIG. 15, in step S110, the skyrmion forming device 1300 may obtain a first image of the magnetization state of the vertical magnetic thin film without applying the horizontal magnetic field.

In step S120, the skyrmion forming device 1300 may obtain a second image of the magnetization state of the vertical magnetic thin film after applying the horizontal magnetic field.

In step S130, the skyrmion forming device 1300 may align the horizontal magnetic field and the surface of the vertical magnetic thin film by adjusting the angle between the horizontal magnetic field and the surface of the vertical magnetic thin film based on a difference between the first image and the second image. According to the embodiment, the skyrmion forming device 1300 may compare an area of the first direction (upward direction) magnetic domain of the first image and an area of the first direction magnetic domain of the second image. If the area of the first direction magnetic domain of the second image is wider than the area of the first direction magnetic domain of the first image, it is determined that the angle is twisted in the first direction, and the angle is adjusted in the second direction (e.g., downward direction), so that the angle between the horizontal magnetic field and the surface of the vertical magnetic thin film may be aligned. Here, according to the embodiment, the degree of the angle to be adjusted may be determined in proportion to a ratio of the area of the first direction magnetic domain between the first image and the second image. According to the embodiment, when the angle adjustment device 1330 adjusts the angle of the horizontal magnetic field generator 1310, the angle adjustment device 1330 may move the emission direction of the horizontal magnetic field generator 1310 by a determined angle in the second direction. According to another embodiment, when the angle adjustment device 1330 adjusts the angle of the surface of the vertical magnetic thin film, the angle adjustment device 1330 may move the surface of the vertical magnetic thin film by a determined angle in the first direction.

According to the embodiment, the steps S110 to S120 may be repeated a plurality of times to increase the accuracy of alignment.

The foregoing examples have described the bubble skyrmion forming device in which the horizontal magnetic field generator 1310 and the vertical magnetic field generator 1320 are separately provided. Hereinafter, a bubble skyrmion forming device which includes one magnetic field generator and is capable of providing the same effect will be described.

Figure 16:
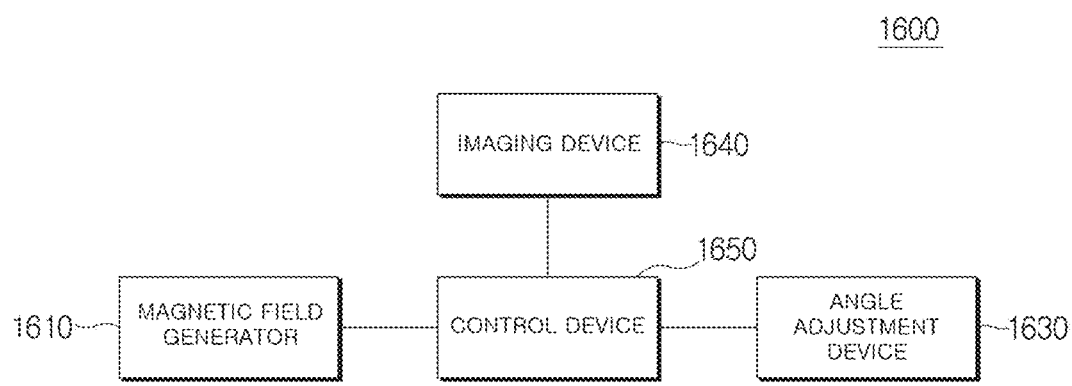
FIG. 16 is a view showing a block diagram of the skyrmion forming device according to various embodiments.

FIG. 16 is a view showing a block diagram of the skyrmion forming device according to various embodiments.

Referring to FIG. 16, the skyrmion forming device 1600 may include a magnetic field generator 1610, an angle adjustment device 1630, an imaging device 1640, and a control device 1650.

The magnetic field generator 1610 may generate a magnetic field which is emitted to the vertical magnetic thin film. The magnetic field generator 1610 may generate a magnetic field such that the magnetic field is incident on the vertical magnetic thin film at a certain angle. When the magnetic field is incident on the surface of the vertical magnetic thin film at a certain angle, the magnetic field may be divided into a horizontal magnetic field component which is parallel with the surface of the vertical magnetic thin film and a vertical magnetic field component which is perpendicular to the surface of the vertical magnetic thin film. Here, the horizontal magnetic field may reduce the width of the magnetic domain having the stripe structure formed on the vertical magnetic thin film. The vertical magnetic field may apply the thermal fluctuation to the vertical magnetic thin film so that a part of a first direction (e.g., upward direction) magnetic domain can be reversed to a second direction (e.g., downward direction) magnetic domain. In other words, the horizontal magnetic field may reduce the stripe width to facilitate the change of the magnetization direction of the magnetic domain of the vertical magnetic field.

The angle adjustment device 1630 may adjust the position of the vertical magnetic thin film or the position of the magnetic field generator such that the magnetic field emitted by the magnetic field generator 1610 and the surface of the vertical magnetic thin film form a predetermined certain angle. Referring to the result of FIG. 12, it can be seen that, in order to form a desired bubble skyrmion, the strength of the horizontal magnetic field must be about 1000 times greater than the strength of the vertical magnetic field. Further, according to the embodiment, in order to have the strength of the horizontal magnetic field and the strength of the vertical magnetic field shown in the result of FIG. 12, the magnetic field and the surface of the vertical magnetic thin film must form an angle of about 0.0835 degrees. Accordingly, the angle adjustment device 1330 may adjust the angle precisely and control such that the angle between the magnetic field emitted by the magnetic field generator 1610 and the surface of the vertical magnetic thin film is 0.0835 degrees.

According to the embodiment, the angle adjustment device 1630 may change the position of the vertical magnetic thin film to adjust such that the magnetic field and the surface of the vertical magnetic thin film have a preset angle.

According to another embodiment, the angle adjustment device 1630 may change the position of the magnetic field generator 1610 or the emission angle of the magnetic field emitted by the magnetic field generator 1610 so that the magnetic field and the surface of the vertical magnetic thin film have a preset angle.

The imaging device 1640 may measure the magnetization state of the vertical magnetic thin film in order to check whether the bubble skyrmion has been formed in the vertical magnetic thin film. The imaging device 1640 may additionally exist in the skyrmion forming device proposed in the present invention.

The control device 1650 may control the angle adjustment device 1630 such that the magnetic field and the surface of the vertical magnetic thin film form a preset angle. The control device 1650 should be capable of controlling very precisely the angle of 0.01 degrees or less.

As described above, according to the present invention, by applying the horizontal magnetic field and the vertical magnetic field, the bubble skyrmion can be formed regardless of the width of the stripe formed on the vertical magnetic thin film.

What is claimed is:

1. A skyrmion forming device which forms bubble skyrmion on a magnetic thin film of which a first portion is magnetized in an upward direction perpendicular to a surface of the magnetic thin film and of which a second portion is magnetized in a downward direction perpendicular to the surface of the magnetic thin film, and a magnetic domain wall in which a magnetization direction is gradually changed at a boundary between the first portion and the second portion, the skyrmion forming device comprising:
   a horizontal magnetic field generator which generates a horizontal magnetic field horizontal to the surface of the magnetic thin film and applies to the magnetic thin film;
   a vertical magnetic field generator which generates a vertical magnetic field perpendicular to the surface of the magnetic thin film and applies to the magnetic thin film;
   an angle adjustment device which controls an angle such that the horizontal magnetic field and the surface of the magnetic thin film are aligned; and
   a control device,
   wherein the control device aligns the horizontal magnetic field and the surface of the magnetic thin film by controlling the angle adjustment device, and causes the horizontal magnetic field and the vertical magnetic field to be applied to the magnetic thin film by controlling the horizontal magnetic field generator and the vertical magnetic field generator.

2. The skyrmion forming device of claim 1, further comprising an imaging device which captures a magnetization state of the magnetic thin film, wherein the control device controls the angle adjustment device based on the magnetization state of the magnetic thin film obtained through the imaging device.

3. The skyrmion forming device of claim 2, wherein the control device obtains, from the imaging device, a first image showing the magnetization state of the magnetic thin film when the horizontal magnetic field is not applied, obtains, from the imaging device, a second image showing the magnetization state of the magnetic thin film after the horizontal magnetic field is applied, determines, by comparing the first image and the second image, whether the magnetization state of the magnetic thin film is changed, and controls the angle adjustment device based on the result of the determination.

4. The skyrmion forming device of claim 3,
   wherein the first image and the second image comprise a first direction magnetic domain which shows a magnetized region in a first direction,
   wherein the first direction is the upward direction or the downward direction,
   and wherein the control device compares an area of the first direction magnetic domain of the first image and an area of the first direction magnetic domain of the second image, determines that there is a change in the magnetization state of the magnetic thin film when the area is changed, and determines that there is no change in the magnetization state of the magnetic thin film when the area is not changed and thus the horizontal magnetic field and the surface of the magnetic thin film are aligned.

5. The skyrmion forming device of claim 4, wherein the angle adjustment device adjusts a position of the surface of the magnetic thin film based on the control of the control device.

6. The skyrmion forming device of claim 4, wherein the angle adjustment device adjusts an emission angle of the horizontal magnetic field emitted by the horizontal magnetic field generator or a position of the horizontal magnetic field generator, based on the control of the control device.

7. The skyrmion forming device of claim 6, wherein the angle adjustment device additionally adjusts an emission angle of the vertical magnetic field emitted by the vertical magnetic field generator based on the control of the control device.

8. A skyrmion forming method of a skyrmion forming device which forms bubble skyrmion on a magnetic thin film of which a first portion is magnetized in an upward direction perpendicular to a surface of the magnetic thin film and of which a second portion is magnetized in a downward direction perpendicular to the surface of the magnetic thin film, and a magnetic domain wall in which a magnetization direction is gradually changed at a boundary between the first portion and the second portion, the skyrmion forming method comprising:

aligning the surface of the magnetic thin film and a horizontal magnetic field to be applied to the magnetic thin film; and applying the horizontal magnetic field and a vertical magnetic field to the magnetic thin film, wherein the aligning the surface of the magnetic thin film and a horizontal magnetic field to be applied to the magnetic thin film comprises controlling an angle adjustment device based on a magnetization state of the magnetic thin film, and wherein the controlling the angle adjustment device based on the magnetization state of the magnetic thin film comprises:

obtaining a first image showing the magnetization state of the magnetic thin film when the horizontal magnetic field is not applied, obtaining a second image showing the magnetization state of the magnetic thin film after the horizontal magnetic field is applied;

determining, by comparing the first image and the second image, whether the magnetization state of the magnetic thin film is changed; and controlling the angle adjustment device based on the result of the determination.

9. The skyrmion forming method of claim 8,
wherein the first image and the second image comprise a first direction magnetic domain which shows a magnetized region in a first direction, wherein the first direction is the upward direction or the downward direction, and wherein the determining, by comparing the first image and the second image, whether the magnetization state of the magnetic thin film is changed comprises:

comparing an area of the first direction magnetic domain of the first image and an area of the first direction magnetic domain of the second image, determining that there is a change in the magnetization state of the magnetic thin film when the area is changed; and determining that there is no change in the magnetization state of the magnetic thin film when the area is not changed.

10. The skyrmion forming method of claim 9, wherein the controlling the angle adjustment device comprises controlling the angle adjustment device to adjust a position of the surface of the magnetic thin film.

11. The skyrmion forming method of claim 9,
wherein the controlling the angle adjustment device comprises:

controlling the angle adjustment device to adjust an emission angle of the horizontal magnetic field emitted by a horizontal magnetic field generator; or controlling the angle adjustment device to adjust a position of the horizontal magnetic field generator.

12. The skyrmion forming method of claim 11,
wherein the controlling the angle adjustment device further comprises controlling the angle adjustment device to adjust an emission angle of the vertical magnetic field of a vertical magnetic field generator.

13. A skyrmion forming device which forms bubble skyrmion on a magnetic thin film of which a first portion is magnetized in an upward direction perpendicular to a surface of the magnetic thin film and of which a second portion is magnetized in a downward direction perpendicular to the surface of the magnetic thin film, and a magnetic domain wall in which a magnetization direction is gradually changed at a boundary between the first portion and the second portion, the skyrmion forming device comprising:

a magnetic field generator which applies a magnetic field to the magnetic thin film;

an angle adjustment device which controls the magnetic field and the surface of the magnetic thin film to have a predetermined angle; and a control device, wherein the control device controls the angle adjustment device such that the magnetic field and the surface of the magnetic thin film have the predetermined angle and control the magnetic field generator to emit the magnetic field to the magnetic thin film.

14. The skyrmion forming device of claim 13, further comprising an imaging device which captures a magnetization state of the magnetic thin film, wherein the control device determines whether the bubble skyrmion is formed on the magnetic thin film, based on the magnetization state of the magnetic thin film obtained through the imaging device.

15. The skyrmion forming device of claim 13, wherein the angle adjustment device adjusts a position of the surface of the magnetic thin film based on the control of the control device.

16. The skyrmion forming device of claim 13, wherein the angle adjustment device adjusts an emission angle of the magnetic field emitted by the magnetic field generator or a position of the magnetic field generator, based on the control of the control device.

* * * * *